United States Patent
Brandt

(10) Patent No.: US 6,522,202 B2
(45) Date of Patent: Feb. 18, 2003

(54) CURRENT CONTROLLED POWER AMPLIFIER

(75) Inventor: Per-Olof Brandt, Staffanstorp (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/879,075

(22) Filed: Jun. 12, 2001

(65) Prior Publication Data

US 2002/0186083 A1 Dec. 12, 2002

(51) Int. Cl.[7] .................................................. H03G 3/10
(52) U.S. Cl. ........................................ 330/285; 330/298
(58) Field of Search .............................. 330/129, 133, 330/279, 285, 298, 207 P

(56) References Cited

U.S. PATENT DOCUMENTS

| | | | | |
|---|---|---|---|---|
| 4,158,180 A | * | 6/1979 | Challen | 330/298 |
| 4,580,287 A | | 4/1986 | Richards, Jr. | 455/226 |
| 5,442,322 A | | 8/1995 | Kornfeld et al. | 330/285 |
| 5,493,255 A | | 2/1996 | Murtojarvi | 330/296 |
| 5,497,125 A | | 3/1996 | Royds | 330/290 |
| 5,572,166 A | | 11/1996 | Gilbert | 330/254 |
| 5,903,192 A | * | 5/1999 | Ludwig et al. | 330/279 |
| 5,999,051 A | | 12/1999 | Terada et al. | 330/254 |
| 6,008,698 A | | 12/1999 | Dacus et al. | 330/279 |
| 6,148,220 A | * | 11/2000 | Sharp et al. | 455/572 |

FOREIGN PATENT DOCUMENTS

| | | |
|---|---|---|
| EP | 0 722 292 A2 | 5/1997 |
| WO | WO 94/01930 | 1/1994 |
| WO | WO 00/39935 | 7/2000 |

OTHER PUBLICATIONS

European Patent Office Search Report, RS 107643 US, dated Nov. 20, 2001.

* cited by examiner

Primary Examiner—Benny T. Lee
Assistant Examiner—Henry Choe
(74) Attorney, Agent, or Firm—Jenkens & Gilchrist, P.C.

(57) ABSTRACT

A circuit for regulating the power provided to a load connected to an output of a power amplifier. The circuit using a control current, rather than a control voltage, to bias the power amplifier.

23 Claims, 4 Drawing Sheets

CURRENT CONTROLLED POWER AMPLIFIER

BACKGROUND OF THE INVENTION

1. Field of the Invention

The present invention is generally related to power amplifiers, and, more specifically, to a system and method for regulating the power produced by a power amplifier.

2. Discussion of the Background

In certain communication systems, for example, the Global System for Mobile Communication (GSM), the output power of a transmitter within a communication device (e.g., a mobile phone) has to be well controlled due to the specifications of the communication system. In transmitters used in GSM and GSM like systems, the output power of the transmitter is controlled by employing a control circuit that produces a control voltage for biasing a power amplifier of the transmitter. For example, a high control voltage produces higher output power and a low control voltage produces lower output power. In this way, a control voltage that biases the power amplifier can be used to control the output power.

However, a problem with using a control voltage to bias the power amplifier is that there is not a pure linear relationship between the control voltage and the output power. In other words, there is not a constant gain. FIG. 1 is a graph that illustrates the relationship between the control voltage and the current consumed by the power amplifier (also referred to as the "collector current"). The collector current is proportional to the output power. Therefore, FIG. 1 illustrates indirectly the relationship between the control voltage and the output power. As seen in FIG. 1, there is a low gain when the control voltage is below $V_{low}$, a high gain when the control voltage is between $V_{low}$ and $V_{high}$, and a low gain when the control voltage is greater than $V_{high}$. Thus, a constant gain is not achieved. Specifically, when the control voltage is either low or high, the gain is essentially zero, and when the control voltage is in the middle region (i.e., between low and high), the gain can vary by a factor greater than 10.

It is desirable that there be a constant gain between the control signal and collector current.

SUMMARY OF THE INVENTION

The present invention overcomes the disadvantages described above by using a control current, rather than a control voltage, to bias the power amplifier. As shown in FIG. 2, the relationship between the control current and the collector current is much more linear than the relationship between the control voltage and the collector current. Thus, using a control current to bias the power amplifier a more constant gain is achieved.

Advantageously, according to one embodiment, a feed forward technique is used in conjunction with the control current. The feed forward technique is most useful in the situations where it is desired to operate the power amplifier at high output power levels.

Further features and advantages of the present invention, as well as the structure and operation of various embodiments of the present invention, are described in detail below with reference to the accompanying drawings.

It should be emphasized that the term "comprises/comprising" when used in this specification is taken to specify the presence of stated features, integers, steps, or components but does not preclude the presence or addition of one or more other features, integers, steps, components or groups thereof.

BRIEF DESCRIPTION OF THE DRAWINGS

The accompanying drawings, which are incorporated herein and form part of the specification, illustrate various embodiments of the present invention and, together with the description, further serve to explain the principles of the invention and to enable a person skilled in the pertinent art to make and use the invention. In the drawings, like reference numbers indicate identical or functionally similar elements. Additionally, the left-most digit(s) of a reference number identifies the drawing in which the reference number first appears.

DETAILED DESCRIPTION OF THE EMBODIMENTS

Figure 3:
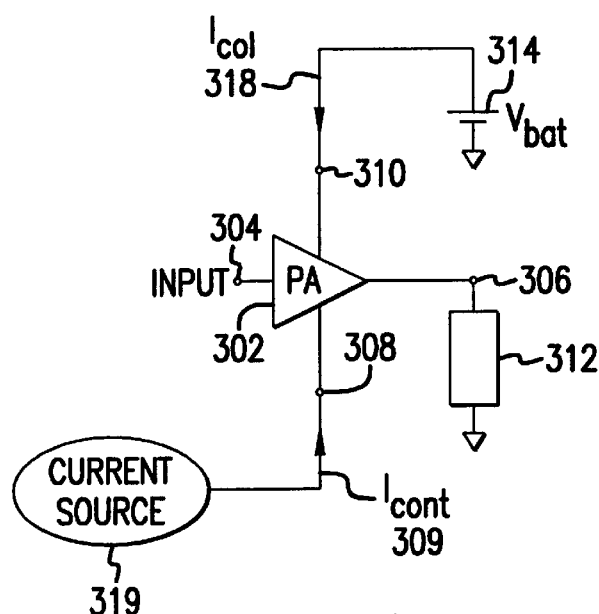
FIG. 3 is a functional block diagram of one embodiment of a circuit according to the present invention.

FIG. 3 is a functional block diagram of one embodiment according to the present invention. A circuit 300 includes a power amplifier 302 having an input 304 for receiving an input signal, an output 306 for connecting to a load 312, a control input 308 for receiving a control current ($I_{cont}$) 309, and a power input 310 for coupling power amplifier 302 to a power source ($V_{bat}$) 314.

Figure 1:
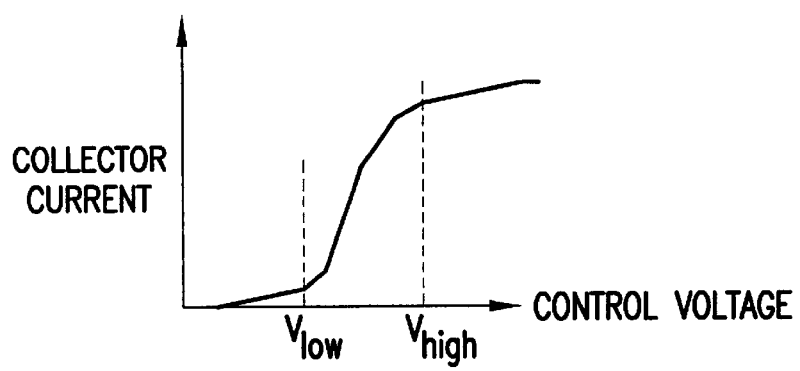
FIG. 1, previously described, is a graph that illustrates the relationship between the control voltage and the collector current.
Figure 2:
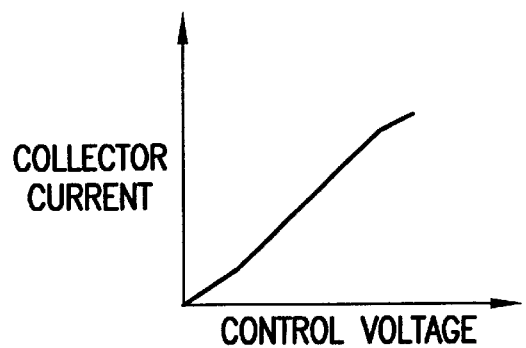
FIG. 2, previously described, is a graph that illustrates the relationship between the control current and the collector current.

Advantageously, the circuit 300 also includes a controllable current source 319 that produces the control current 309. The control current 309 is used to control the amount of power delivered to the load 312 (also referred to as the "output power"). As shown in FIG. 2, there is a linear (or nearly linear) relationship between the control current 309 and a collector current 318, the collector current 318 being proportional to the output power. Therefore, by changing the amount of the control current 309, one is able to change the collector current 318 by a proportional amount, and, thereby, change the output power by a proportional amount. For example, if the output power should be increased, the current source 319 is set to increase the amount of the control current 309, which causes the output power to increase. Similarly, if the output power should be decreased, the current source 319 is set to decreases the amount of the control current 309, which causes the output power to decrease.

Figure 4:
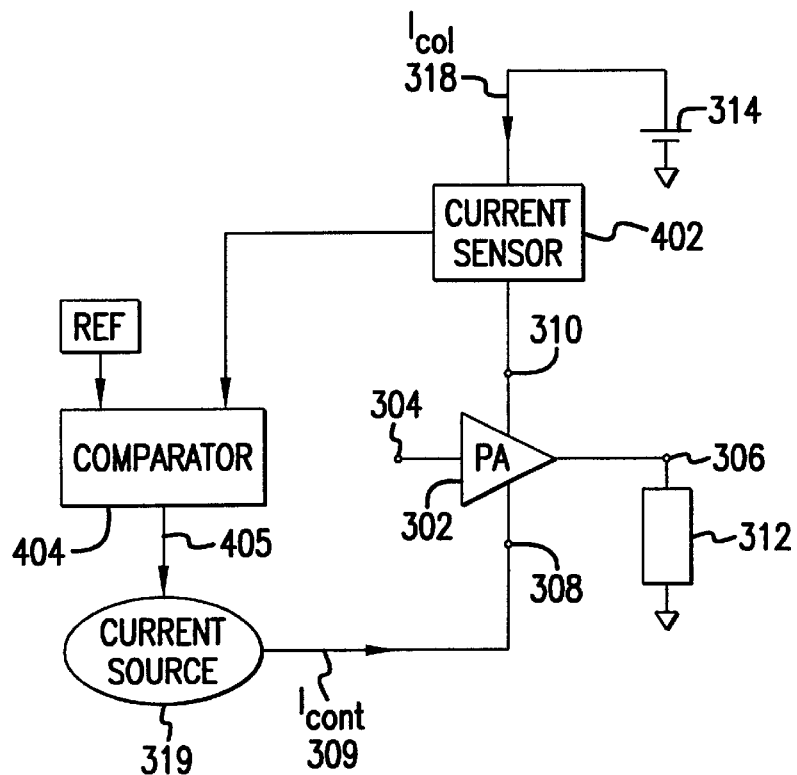
FIG. 4 illustrates an exemplary practical application of the present invention.

FIG. 4 illustrates an exemplary practical application of the present invention. As shown in FIG. 4, a current sensor 402 is used to provide a reading of the collector current 318. More specifically, the current sensor 402 outputs a signal, such as a voltage ($V_{sense}$), that corresponds to the amount of the current 318 flowing into the power amplifier 302 (i.e., the "collector current"). This signal is provided as an input to a comparator 404, which is coupled to and controls the current source 319. The comparator 404 compares the signal to a reference signal and adjusts the magnitude of the control current 309 as a function of the difference between the signal from the current sensor 402 and the reference signal by sending a control signal 405 to the current source 319. In this way, the comparator 404 and the current source 319 can be used to regulate the output power as a function of the reference signal.

For example, if it is desired to keep the output power at a constant level, the reference signal is kept constant and the comparator 404 is configured to increase the control current 309 if the signal from the current sensor 402 is less than the reference signal and to decrease the control current 309 if the signal from the current sensor 402 is greater than the reference signal. In this way, the comparator 404 and the current source 319 keep the collector current 318 constant, and, thereby regulate the output power.

Figure 5:
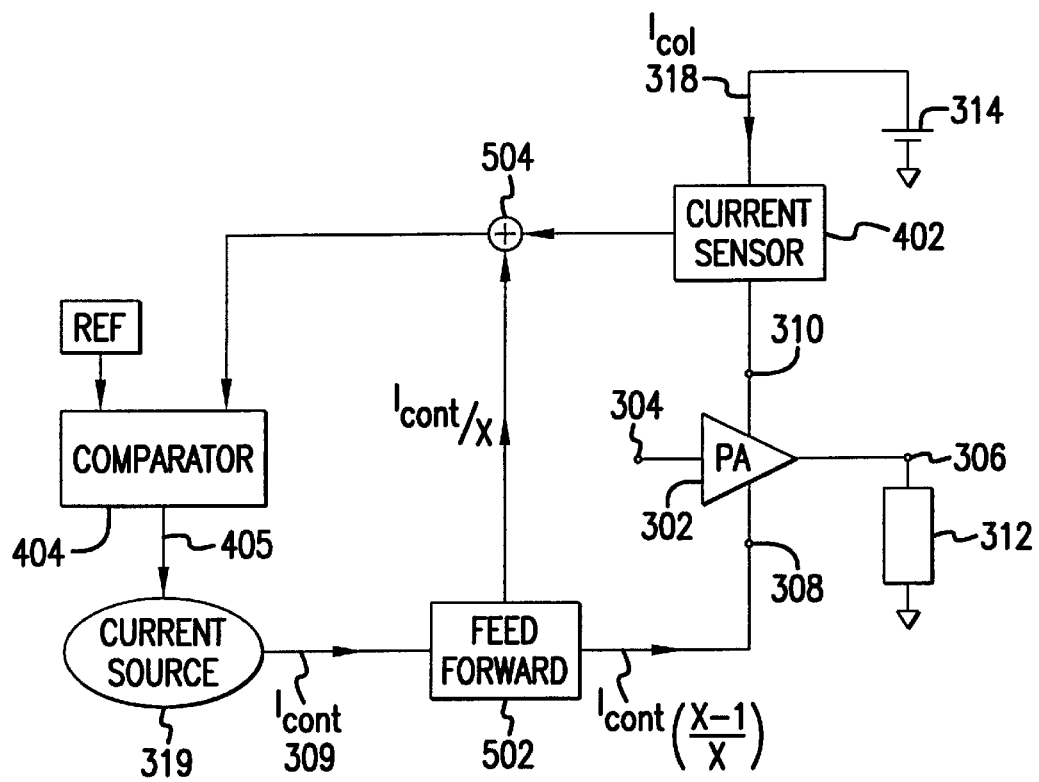
FIG. 5 is a block diagram that illustrates a feed forward circuit used in conjunction with teachings of the present invention.

FIG. 5 is a block diagram that illustrates a feed forward circuit 502 used in conjunction with teachings of the present invention. A feed forward circuit 502 functions to feed a portion of the control current 309 to an adder 504 that adds an output of the feed forward circuit 502 to the output of current sensor 402. The output of the adder 504 is provided to a first input of the comparator 404. The reference signal is provided to a second input of the comparator 404. Thus, the comparator 404 compares a signal equivalent to Icol+ Icont/X to the reference signal. This embodiment of the invention is useful in the situation where a high output power is desired.

Figure 6:
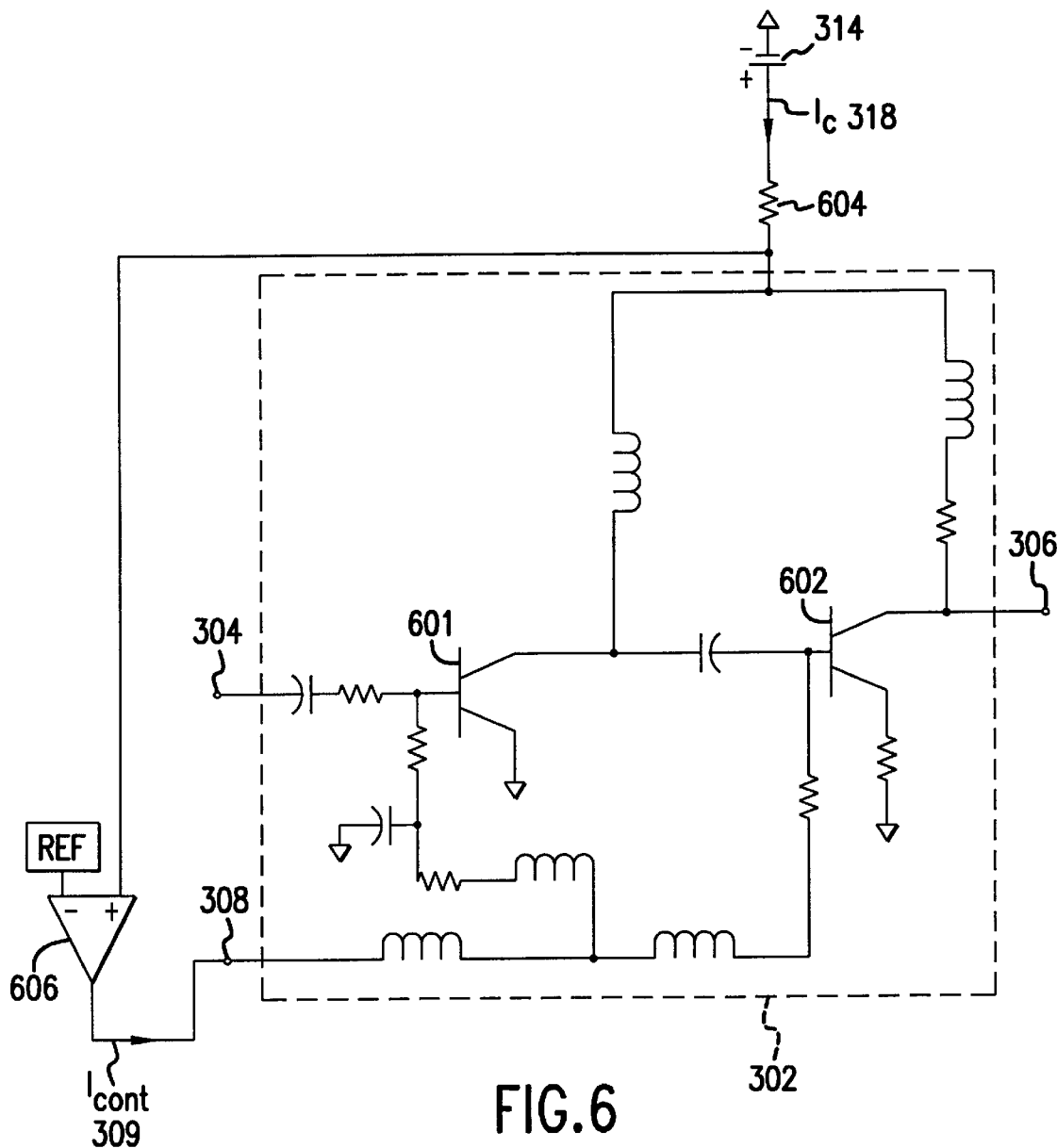
FIG. 6 is a circuit diagram illustrating a circuit for implementing an embodiment of the present invention as shown in FIG. 4

FIG. 6 is a circuit diagram illustrating a circuit 600 for implementing an embodiment of the present invention as shown in FIG. 4. One skilled in the art understands that circuit 600 is not the only way to implement the high level circuit shown in FIG. 4 and that the invention is not limited to the specific circuit shown in FIG. 6 or any other specific circuit. As shown in FIG. 6, the power amplifier 302 is implemented with two bi-polar junction transistors 601 and 602, the current sensor 402 is implemented with a resistor 604, and the comparator 404 and the current source 319 are implemented using an operational amplifier (op-amp) 606. The power amplifier 302 shown in FIG. 6 functions to receive an input signal and produce an output signal that is an amplified version of the input signal. The op-amp 606 functions to output the current 309, which is used to control the output power of the power amplifier 302.

Figure 7:
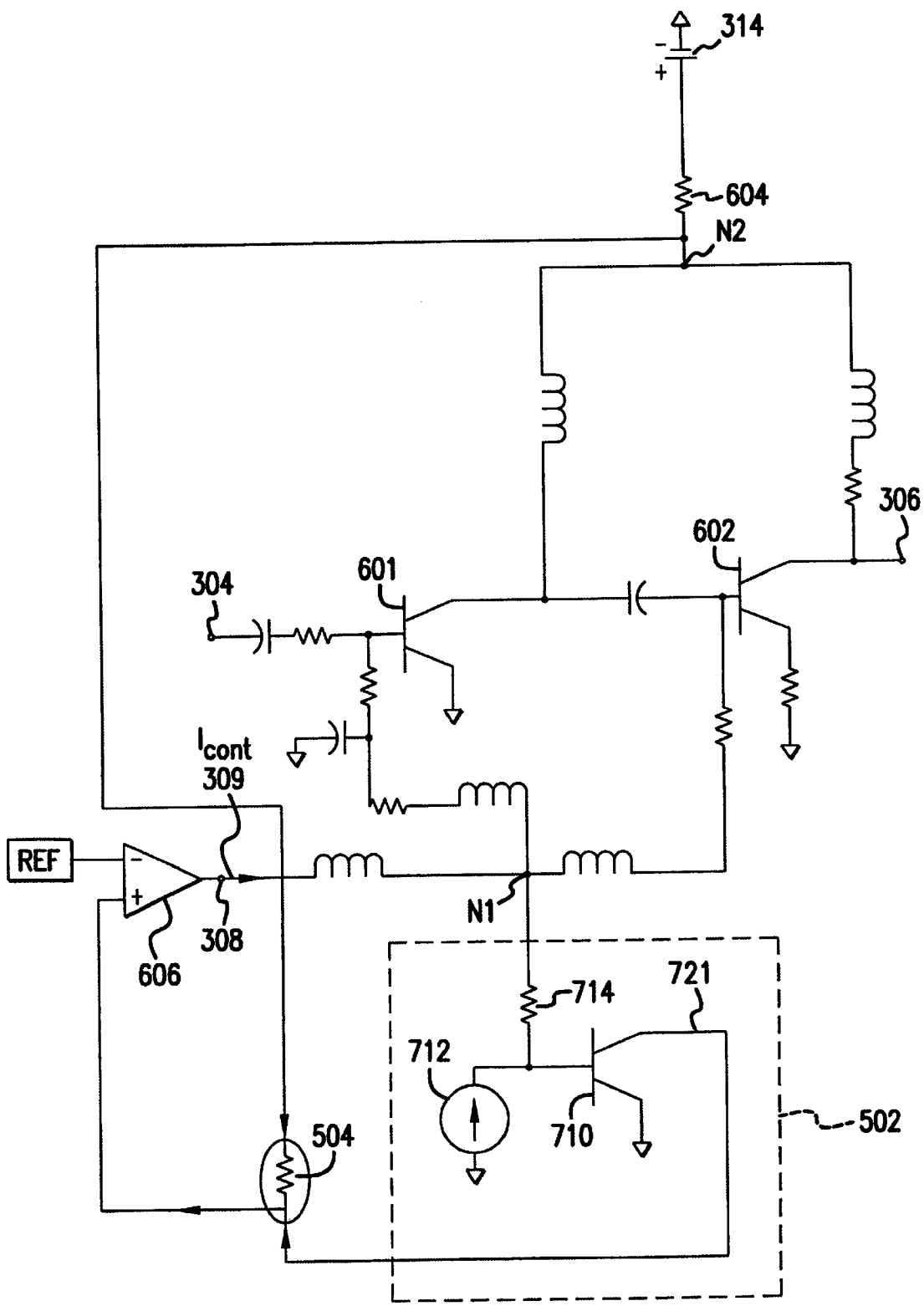
FIG. 7 is a circuit diagram illustrating the circuit shown in FIG. 6 with a feed forward circuit, according to one embodiment.

FIG. 7 is a circuit diagram illustrating the circuit 600 with a feed forward circuit 502, and an adder 504, according to one embodiment. One skilled in the art will appreciate that the specific feed forward circuit 502 that is shown in FIG. 7 is not the only way to implement a feed forward circuit and that the invention is not limited to the specific circuit shown in FIG. 7 or any other specific circuit. As shown in FIG. 7, the feed forward circuit 502 includes a bi-polar junction transistor 710, a DC current source 712, and a first resistor 714. The adder 504 is implemented with a resistor. The DC current source 712 is connected between ground and the base of the transistor 710. The first resistor 714 is connected between the base of the transistor 710 and a node N1. A first input 721 of the adder 504 is connected to the collector of the transistor 710 and a second input 722 of the adder 504 is connected to a node N2. An output 723 of the adder 504 is connected to an input of the op-amp 606. The emitter of transistor 710 is connected to ground.

As described above, the feed forward circuit 502 functions to feed a portion of the control current 309 to the adder 504, which adds the output of the feed forward circuit 502 to the output of the current sensor 402 (in this case, the resistor 604) to produce an output that is provided to an input of the op-amp 606.

While various embodiments of the present invention have been described above, it should be understood that they have been presented by way of example, and not limitation. It will be understood by those skilled in the art that various changes in form and detail may be made therein without departing from the spirit and scope of the invention as defined by the following claims. Thus the breadth and scope of the present invention should not be limited by any of the above-described exemplary embodiments, but should be defined only in accordance with the following claims and their equivalents.

What is claimed is:

1. A circuit, comprising:
    a power amplifier that amplifies a signal received at an input of the power amplifier, the power amplifier having a control input for receiving a control current for biasing the power amplifier, a power input for coupling to a power source, and an output that provides the amplified signal to a load;
    a controllable current source, coupled to the control input, that generates the control current, wherein the control current is used to regulate the power delivered to the load by the power amplifier;
    a current sensor for outputting a signal corresponding to the amount of current flowing into the power amplifier from the power source; and
    a feed forward circuit that functions to output a portion of the control current.

2. The circuit of claim 1, further comprising
    a comparator that is coupled to and controls the controllable current source, wherein
        the comparator compares the signal outputted by the current sensor to a reference signal and controls the controllable current source based on the result of the comparison.

3. The circuit of claim 2, wherein the current sensor comprises a resistor connected between the power source and the power input.

4. The circuit of claim 2, wherein if the signal outputted by the current sensor is greater than the reference signal the comparator controls the current source such that the control current is decreased.

5. The circuit of claim 2, wherein if the signal outputted by the current sensor is less than the reference signal the comparator controls the current source such that the control current is increased.

6. The circuit of claim 1, further comprising:
    an adder that adds the output of the feed forward circuit to the output of the current sensor, wherein the output of the adder is provided to an input of a comparator and a reference signal is provided to another input of the comparator, such that the comparator compares the output of the adder to the reference signal.

7. The circuit of claim 1, wherein the power amplifier is implemented with bi-polar junction transistors.

8. A circuit, comprising:
    amplification means for amplifying a signal received at an input of the amplification means, the amplification means having a control input for receiving a control current for biasing the amplification means, a power input for coupling to a power source, and an output that provides the amplified signal to a load;

current providing means for generating the control current, the current providing means being coupled to the control input, wherein the control current is used to regulate the power delivered to the load by the amplification means;

current sensing means for outputting a signal corresponding to the amount of current flowing into the amplification means from the power source; and feed forward means that functions to output a portion of the control current.

9. The circuit of claim 8, further comprising
a comparator that is coupled to and controls the current providing means, wherein
the comparator compares the signal outputted by the current sensing means to a reference signal and controls the current providing means based on the result of the comparison.

10. The circuit of claim 9, wherein the current sensing means comprises a resistor connected between the power source and the power input.

11. The circuit of claim 9, wherein if the signal outputted by the current sensing means is greater than the reference signal the comparator controls the current providing means such that the control current is decreased.

12. The circuit of claim 9, wherein if the signal outputted by the current sensing means is less than the reference signal the comparator controls the current providing means such that the control current is increased.

13. The circuit of claim 8, further comprising:
an adder that adds the output of the feed forward circuit to the output of the current sensing means, wherein the output of the adder is provided to an input of a comparator and a reference signal is provided to another input of the comparator, such that the comparator compares the output of the adder to the reference signal.

14. The circuit of claim 8, wherein the amplification means is implemented with bi-polar junction transistors.

15. In a circuit comprising a power amplifier comprising an input for receiving a signal, a control input for receiving a control current for biasing the power amplifier, a power input for coupling to a power source, and an output for connecting the power amplifier to a load, a method, comprising the steps of:
amplifying the signal received at the input of the power amplifier;

providing the amplified signal to the load, thereby providing power to the load; and generating the control current;

delivering the control current to the control input, wherein the control current is used to regulate the power delivered to the load by the power amplifier by biasing the power amplifier; and providing a portion of the control current to an adder, wherein the adder adds the portion of the control current to an output of a current sensor.

16. The method of claim 15, further comprising the steps of measuring the current flowing into the power amplifier from the power source.

17. The method of claim 16, wherein the step of measuring the current flowing into the power amplifier from the power source comprises the step of generating a voltage corresponding to the amount of current flowing into the power amplifier from the power source.

18. The method of claim 17, further comprising the step of comparing the voltage to a reference voltage.

19. The method of claim 17, further comprising the step of increasing or decreasing the control current depending on the result of the comparison of the voltage to the reference voltage.

20. A method, comprising:
receiving a signal at an input of a power amplifier;
amplifying the signal to produce an amplified signal;
providing the amplified signal to a load, thereby delivering power to the load;
controlling the power delivered to the load by using a control current to bias the power amplifier; and
providing a portion of the control current to an adder, wherein the adder adds the portion of the control current to an output of a current sensor.

21. The method of claim 20, further comprising the step of producing a voltage corresponding to an amount of current flowing into the power amplifier from a power source.

22. The method of claim 21, further comprising the step of comparing the voltage to a reference voltage.

23. The method of claim 22, further comprising the step of increasing or decreasing the control current depending on the result of the comparison of the voltage to the reference voltage.

* * * * *